United States Patent
Jiang et al.

(10) Patent No.: US 8,466,743 B2
(45) Date of Patent: Jun. 18, 2013

(54) GROUND-REFERENCED COMMON-MODE AMPLIFIER CIRCUIT AND RELATED METHOD

(75) Inventors: Xicheng Jiang, Irvine, CA (US); Jungwoo Song, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 78 days.

(21) Appl. No.: 12/799,598

(22) Filed: Apr. 27, 2010

(65) Prior Publication Data

US 2011/0260793 A1    Oct. 27, 2011

(51) Int. Cl.
*H03F 3/217*    (2006.01)
(52) U.S. Cl.
USPC .......................................... 330/251
(58) Field of Classification Search
USPC ..................... 330/10, 207 A, 251
See application file for complete search history.

(56) References Cited

U.S. PATENT DOCUMENTS

| | | | |
|---|---|---|---|
| 7,551,028 B1* | 6/2009 | Cyrusian | 330/251 |
| 7,768,347 B2* | 8/2010 | De Cremoux | 330/251 |
| 2010/0225391 A1* | 9/2010 | Kim | 330/251 |

* cited by examiner

*Primary Examiner* — Khanh V Nguyen
(74) *Attorney, Agent, or Firm* — Farjami & Farjami LLP

(57) ABSTRACT

Disclosed is an amplifier circuit configured to amplify a pulse stream. The amplifier circuit comprises a switching block including a first switch operable to couple an output node of the switching block to a positive reference voltage, a second switch operable to couple the output node to a ground reference voltage and a third switch operable to couple the output node to a negative reference voltage. The amplifier circuit is configured to amplify the pulse stream into an amplified signal detectable at the output node such that the amplified signal has a common-mode voltage level substantially equal to zero volts. In one embodiment, the amplifier circuit is configured to amplify the pulse stream in accordance with a Class-D amplification scheme. In one embodiment, the output node can be directly connected to a load device without a DC blocking capacitor being interposed between the output node and the load device.

20 Claims, 4 Drawing Sheets

GROUND-REFERENCED COMMON-MODE AMPLIFIER CIRCUIT AND RELATED METHOD

BACKGROUND OF THE INVENTION

1. Field of the Invention

The present invention is generally in the field of electronic circuits and systems. More specifically, the present invention is in the field of power amplification circuitry.

2. Background Art

Power amplifiers play a critical role in driving an electrical load. Electronic systems frequently process a low voltage signal and amplify the signal to drive a higher powered load. For example, many music players process audio data at a low power level and amplify the audio data to a higher power level to drive a higher powered speaker or set of earphones. An efficient and cost effective power amplifier is therefore key to drive higher power loads.

Unfortunately many power amplifier configurations are either inefficient or difficult to package. For example, a linear power amplifier typically utilizes a quiescent biasing current that consumes power even while the amplifier is idle, thereby degrading the power efficiency of the electronic system in which such a linear power amplifier is implemented. Alternatively, a half-bridge configuration switched-mode amplifier, for example, while capable of high efficiency, typically presents a direct-current (DC) bias at its output pins that must be eliminated with mitigating circuitry. That mitigating circuitry may take the form of one or more large blocking capacitors, for example, which occupy printed circuit board (PCB) area and may substantially increase system cost.

Accordingly, there is a need to overcome the drawbacks and deficiencies in the art by providing an improved switched-mode power amplifier configured to eliminate the requirement for DC output blocking circuitry.

SUMMARY OF THE INVENTION

The present invention is directed to a ground-referenced common-mode amplifier circuit and related method, substantially as shown in and/or described in connection with at least one of the figures, as set forth more completely in the claims.

DETAILED DESCRIPTION OF THE INVENTION

Figure 1:
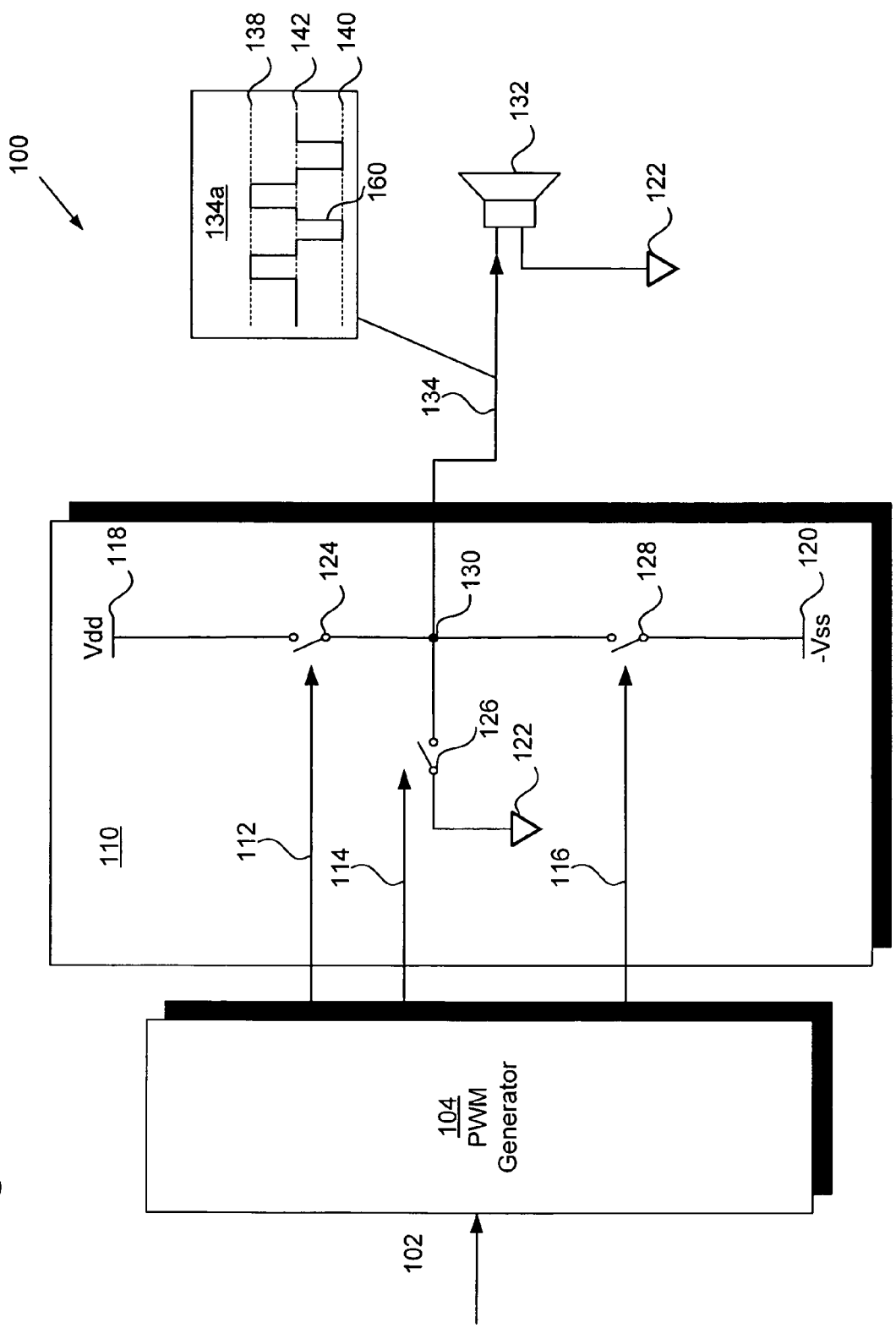
FIG. 1 shows a conceptual block diagram of an exemplary ground-referenced common-mode amplifier circuit, according to one embodiment of the present invention.

The present invention is directed to a ground-referenced common-mode amplifier circuit and related method. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

An efficient power amplifier is key to driving an electrical load. However, many power amplifier configurations cannot efficiently or cost effectively drive a single-ended load. For example, linear power amplifiers are often inefficient. A linear power amplifier typically includes at least one semiconductor device such as a power transistor or power metal-oxide-semiconductor field-effect transistor (MOSFET). Each semiconductor device is typically biased into an active or nominally quiescent state. An input signal is fed into the control terminal of the semiconductor device, for example the MOSFET gate. An amplified output is taken across a non-control terminal such as the MOSFET source or drain. Thus, a linear power amplifier amplifies an input signal using the amplification properties of internal semiconductor devices. Though accurate and able to power a single-ended load, a linear power amplifier tends to waste power and often requires bulky heat sinks to absorb the large amounts of power that is wasted as heat.

Although conventional switching power amplifiers (including conventional Class-D power amplifiers) are more efficient than linear power amplifiers, conventional switching power amplifiers cannot easily drive single-ended loads. Conventional switching power amplifiers use transistor switching modes to regulate power from positive and negative reference sources to an amplified output. These amplifiers typically comprise a positive semiconductor device and a negative semiconductor device connected in a half-bridge configuration.

Input data in the form of a pulse stream, such as a pulse width modulated (PWM) signal, for example, may be simultaneously applied to the control terminals of the positive and negative semiconductor devices. The semiconductor devices produce an amplified output pulse stream with values alternating between the positive reference voltage and the negative reference voltage at the output node. Clearly, the differential nature of the amplified pulse stream is not readily adaptable to a single-ended load without direct-current (DC) biasing circuitry.

Unfortunately, DC biasing circuitry is often expensive or difficult to package on one semiconductor die. One conventional DC biasing circuit comprises a blocking capacitor connected between the power amplifier output and the single-ended load. Although the blocking capacitor converts an amplified pulse stream to a ground-reference signal, the blocking capacitor consumes printed circuit board (PCB)

area and can introduce an unpleasant popping or clicking noise during powering up or powering down of the power amplifier.

A second conventional DC biasing circuit comprises a common-mode half-bridge driver circuit in parallel with the conventional switching power amplifier that outputs an amplified pulse stream corresponding to the amplified signal. In the second DC biasing circuit, the common-mode half-bridge driver circuit is configured to output a common-mode pulse stream with a fifty percent (50%) duty cycle. The common-mode pulse stream is independent of the amplified pulse stream and is compared to the amplified pulse stream. The compared result is adaptable to a single-ended load. Although the second DC biasing circuit lacks a blocking capacitor and is more robust than the first DC biasing circuit, the second DC biasing circuit requires a large area of the semiconductor die to be devoted to the common-mode driver circuit.

By contrast to the deficiencies described in relation to the conventional art, embodiments of the present invention employ a switching amplifier circuit that can provide a substantially zero common-mode voltage level across the output of a switching power amplifier. FIG. 1 shows a conceptual block diagram of ground-referenced common-mode amplifier circuit 100, according to one embodiment of the present invention. FIG. 1 visually depicts one embodiment of the present invention and elements shown in FIG. 1 conceptually represent physical and electrical elements.

In this embodiment, exemplary ground-referenced common-mode amplifier circuit 100 may include PWM generator 104, switching block 110 and single-ended load 132. Single-ended load 132 may be a speaker, earphone or headset, for example. As shown in FIG. 1, input signal 102 may be input into PWM generator 104. Consistent with the embodiment illustrated in FIG. 1, PWM generator 104 may be capable of transforming input signal 102 into an input pulse stream with components detectable on positive line 112, zero line 114 and negative line 116. The input pulse stream may be a PWM to sequence, including for example a three-level pulse stream with a positive value, a zero value and a negative value, as is known in the art. As illustrated, positive line 112, zero line 114 and negative line 116 may be input into switching block 110.

In this embodiment, switching block 110 may include a plurality of switches placed in a T-bridge configuration. In this configuration, switching block 110 may include first switch 124, second switch 126 and third switch 128 connected by output node 130. Each of switches 124, 126 and 128 may be a field-effect transistor (FET). As shown, first switch 124 may be configured to switch positive reference voltage 118 to output node 130. Similarly, second switch 126 may be operable to couple ground reference 122 to output node 130. Third switch 128 may be operable to couple negative reference voltage 120 to output node 130. Each of the plurality of switches may be capable of responding to signals on signal lines 112, 114 and 116. In this embodiment, for example, each of switches 124, 126 and 128 may be switched exclusively, so that not more than one of switches 124, 126, and 128 is closed at a given time.

Consistent with this embodiment of the invention, connector 134 may directly couple common node 130 to single-ended load 132. Connector 134 may comprise a wire or a conductive layer within a semiconductor die, package or PCB. Switching block 110 may therefore include a structure capable of providing an amplified version of input signal 102 to single-ended load 134. Advantageously, the arrangement of switching block 110 avoids the requirement for a DC blocking capacitor to filter the output provided to load 132, which adds cost and complexity in the conventional art. Moreover, in some embodiments, the structure of switching block 110 may be packaged into one semiconductor die.

Another embodiment of the present invention may include more than three switches. Like the three-switch embodiment shown in FIG. 1, the other embodiment may comprise a ground switch to connect a ground node to a common node, a positive reference switch to connect a positive reference voltage to the common node, and a negative reference switch to connect a negative reference voltage to the common node. However, unlike the three-switch embodiment shown in FIG. 1, the other embodiment may further comprise at least one intermediate positive switch to switch at least one intermediate positive voltage between zero volts (0V) and the positive reference voltage onto the common node. Additionally, the other embodiment may comprise at least one intermediate negative switch to switch at least one intermediate negative voltage between zero volts (0V) and the negative reference voltage onto the common node. In this other embodiment, the at least one intermediate negative voltage may have the same magnitude, or absolute value, as the at least one intermediate positive voltage. The at least one intermediate positive voltage may be a plurality of intermediate positive voltages between 0V and the positive reference voltage; the at least one intermediate negative voltage may be a plurality of intermediate negative voltages between 0V and the negative reference voltage. Consistent with this other embodiment of the present invention, a modulated pulse signal with a modulation level greater than a three-level modulation scheme may be switched onto the common node.

Figure 2:
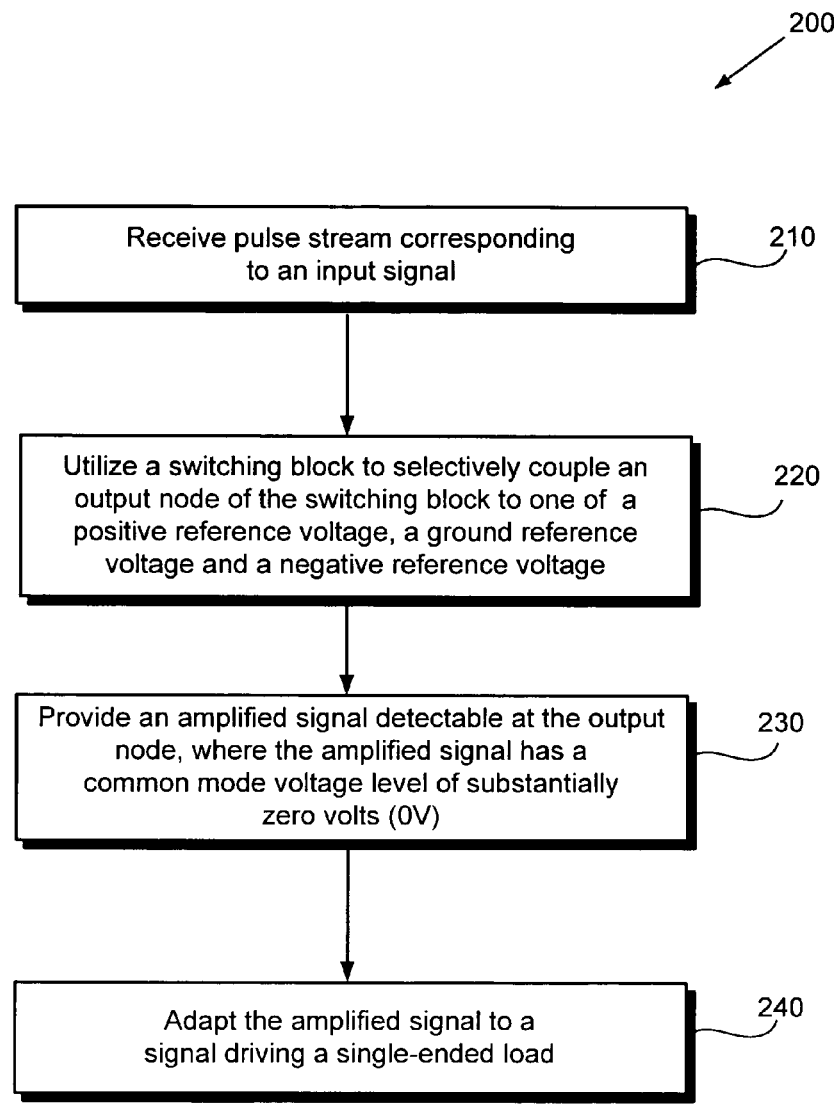
FIG. 2 is a flowchart presenting a method for use by a ground-referenced common-mode amplifier circuit, according to one embodiment of the present invention.

The exemplary embodiment of ground-referenced common-mode power amplifier circuit 100 illustrated in FIG. 1 will be further described by reference to flowchart 200 in FIG. 2, which describes the steps, according to one embodiment of the present invention, of a method for use by a switching circuit, such as switching circuit 110 in FIG. 1, to amplify a pulse stream. It is noted that certain details and features have been left out of flowchart 200 that are apparent to a person of ordinary skill in the art. For example, a step may comprise one or more substeps as known in the art. While steps 210 through 240 indicated in flowchart 200 are sufficient to describe one embodiment of the present invention, other embodiments of the invention may utilize steps different from those shown in flowchart 200.

Turning to step 210 of flowchart 200, step 210 comprises receiving a pulse stream corresponding to an input signal. Returning to FIG. 1, switching block 110 may be configured to receive a pulse stream corresponding to input signal 102. More specifically, input signal 102 may comprise a low power signal corresponding to audio or other data in analog or digital form. For example, input signal 102 may comprise audio data or other data stored in sinusoidal form. Input signal 102 may be supplied to PWM generator 104.

Consistent with the embodiment shown in FIG. 1, PWM generator 104 may be configured to output control signals along positive line 112, zero line 114 and negative line 116. The control signals may respectively correspond to a positive component, a zero component and a negative component of a pulse stream (for example, a portion of a PWM signal) corresponding to input signal 102. Each control signal may therefore correspond to a discrete component of an input pulse stream to switching block 110, for instance. The positive component may be detectable on positive line 112, the zero component may be detectable on zero line 114 and the negative component may be detectable on negative line 116 of switching block 110. Thus, switching block 110 may be configured to receive a pulse stream corresponding to an input signal.

Turning to step 220 of flowchart 200, step 220 comprises utilizing a switching block of the switching circuit to selectively couple an output node of the switching block to one of a positive reference voltage, a ground reference voltage and a negative reference voltage. Returning to FIG. 1, switches 124, 126 and 128 may be utilized to selectively couple output node 130 to components of the input pulse stream present at positive line 112, zero line 114 and negative line 116. Consequently, first switch 124 may close when a positive pulse that is indicated by a signal on positive line 112, appears. In this case, positive reference voltage 118 may be selectively coupled to output node 130. Furthermore, third switch 128 may close when a negative pulse that is indicated by a signal on negative line 116, appears. In that case, negative reference voltage 120 would be selectively coupled to output node 130. Soon after either positive or negative pulses appear, switching block 110 may be configured to close second switch 126 and selectively couple ground node 122 to output node 130. As the switching of switches 124, 126 and 128 indicates, embodiments of the present invention may create a Class-D amplification scheme. Switching block 110 may therefore be used to selectively couple switches 124 and 128 to respectively symmetrical positive and negative reference voltages, and switch 126 to a ground reference.

Turning to step 230 of flowchart 200, step 230 comprises providing an amplified signal detectable at the output node, where the amplified signal has a common-mode voltage level of substantially 0V. Returning to FIG. 1, the amplified pulse stream present at output node 130 may correspond to an amplified signal. For example, values of the voltage at output node 130 may consist of the value of positive reference voltage 118 corresponding to amplified positive values of the pulse stream, the value of negative reference voltage 120 corresponding to the amplified negative values of the pulse stream, and a 0V corresponding to the value at ground node 122. As shown in waveform 134a, present at output node 130, amplified signal 160 may reach positive reference value 138 and negative reference value 140. Between pulses, amplified signal 160 may sit at reference ground value 142. Consequently, an amplified signal at output node 130 may be produced with a common-mode voltage of substantially zero volts (0V).

Figure 3:
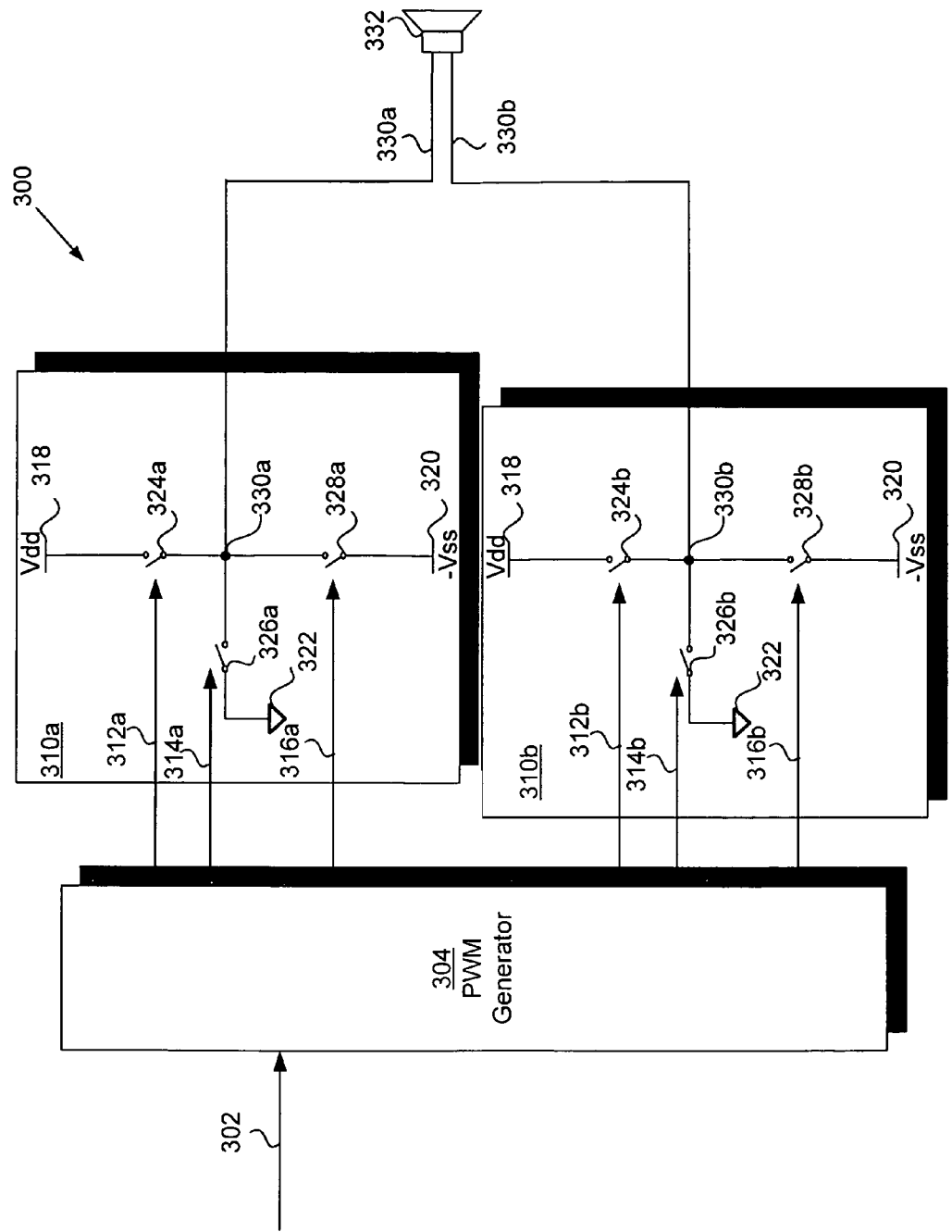
FIG. 3 shows a conceptual block diagram of an exemplary ground-referenced common-mode amplifier circuit, according to one embodiment of the present invention.

Turning to step 240 of flowchart 200, step 240 comprises adapting the amplified signal to a signal driving a single-ended load. Returning to FIG. 1, the amplified pulse stream present at output node 130 may be filtered or modified to drive a single-ended load. For example, the signal at output node 130 may be passed into a low pass filter (not pictured in FIG. 1) to remove the components of the ramp signal previously added by PWM generator 104 when the pulse stream was produced. The resulting signal may be used to drive single-ended load 134. As such, an amplified signal including for example, an amplified audio signal may drive single-ended load 134 based on a ground-referenced common-mode amplifier that is, for example, packaged on one semiconductor die. The ground-referenced common-mode amplifier of the present invention is not limited to the embodiments described above, however. Turning to FIG. 3, FIG. 3 illustrates ground-referenced common-mode amplifier circuit 300 according to a third embodiment of the present invention. Ground-referenced common-mode amplifier circuit 300 has a voltage swing substantially equal to twice the value of an amplified pulse stream. As shown in FIG. 3, ground-referenced common-mode amplifier circuit 300 may comprise PWM generator 304, first switching block 310a and second switching block 310b. First switching block 310a and second switching block 310b may be connected to the differential inputs of load 332, which may be a speaker, earphone or headset. Input signal 302 may be input into PWM generator 304. PWM generator 304 may be configured to transform input signal 302 into an input pulse stream with multiple components. For example, PWM generator 304 may be capable of outputting a three-level pulse stream. Components of the pulse stream may be detectable on first positive line 312a, first zero line 314a, first negative line 316a, as well as second positive line 312b, second zero line 314b and second negative line 316b. Lines 312a, 314a, and 316a may be input into first switching block 310a, and lines 312b, 314b, and 316b may be input into second switching block 310b.

First switching block 310a may include first switch 324a, second switch 326a and third switch 328a operable to be coupled to first output node 330a. Within first switching block 310a, first switch 324a may be operable to couple positive reference voltage 318 to first output node 330a, second switch 326a may be operable to couple ground node 322 to first output node 330a, and third switch 328a may be operable to couple negative reference voltage 320 to first output node 330a. Similarly, second switching block 310b may include fourth switch 324b, fifth switch 326b and sixth switch 328b operable to be coupled to second output node 330b. Within second switching block 310b, fourth switch 324b may be configured to switch positive reference voltage 318 to second output node 330b, fifth switch 326b may be configured to switch ground node 322 to second output node 330b, and sixth switch 328b may be configured to switch negative reference voltage 320 to second output node 330b. Any of switches 324a, 326a, 328a, 324b, 326b and 328b may be a FET.

In the third embodiment of the present invention, each of first switching block 310a and second switching block 310b may be configured to amplify a pulse stream into an amplified signal that is detectable at their respective output nodes 330a and 330b. More specifically, first switching block 310a may be configured to receive a pulse stream on lines 312a, 314a and 316a. The pulse stream may correspond to input signal 302, which may be a low power signal; the pulse stream may have been processed by PWM generator 304 into a series of pulses. The pulse stream may be pulse width modulated. Each of switches 324a, 326a and 328a in switching block 310a in FIG. 3 may be selectively switched to produce a first amplified signal detectable at first output node 330a.

Similarly, second switching block 310b may be configured to receive a pulse stream on lines 312b, 314b and 316b. The pulse stream may correspond to input signal 302, which may be a low power signal; the pulse stream may have been processed by PWM generator 304 into a series of pulses. The pulse stream may be pulse width modulated. Each of switches 324b, 326b and 328b in second ground-referenced common-mode amplifier 310b in FIG. 3 may be switched to produce a second amplified signal detectable at second output node 330b.

As shown in FIG. 3, the first amplified signal that is detectable at first output node 330a and the second amplified signal that is detectable at second output node 330b may adapted to be directly coupled to the differential terminals of load 332. Alternatively, the first amplified signal and the second amplified signal may be combined within a buffer circuit (not pictured in FIG. 3) to produce an output signal 338 (also not pictured in FIG. 3), which in turn may be fed into a single-ended load (not pictured in FIG. 3).

Figure 4A:
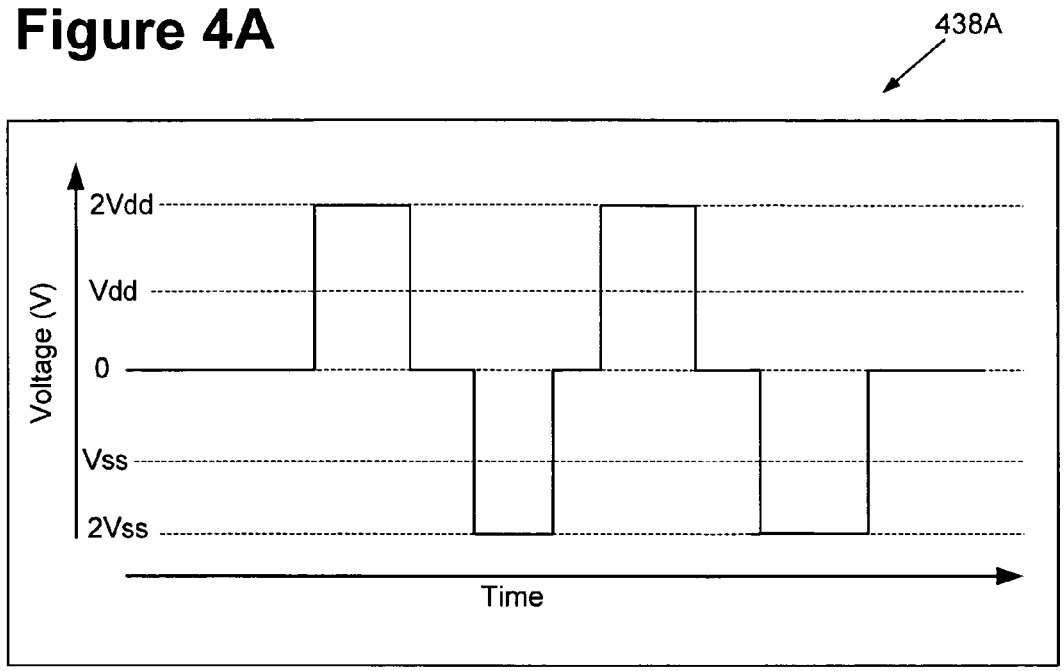
FIG. 4A shows an exemplary output signal waveform capable of being produced by a ground-referenced common-mode amplifier circuit, according to one embodiment of the present invention.

In an embodiment of the present invention that is consistent with FIG. 3, the second amplified signal may comprise an out of phase version of the first amplified signal. In this case, output signal 338 may have twice the amplitude of either the first amplified signal or the second amplified signal. Turning to FIG. 4A, FIG. 4A illustrates sample waveform 438A corresponding to output signal 338, and consistent with the third embodiment. According to FIGS. 3 and 4A, the third embodiment of the present invention may deliver a PWM signal that ranges from double the value of positive reference voltage 318 to double the value of negative reference voltage 320. As such, the third embodiment of the present invention may deliver as much as four times the power amplification provided by the embodiment of FIG. 1, for example. Such a signal may optimize power regulation and delivery to specific classes of loads, including, for instance certain classes of piezoelectric speakers or headphones.

Figure 4B:
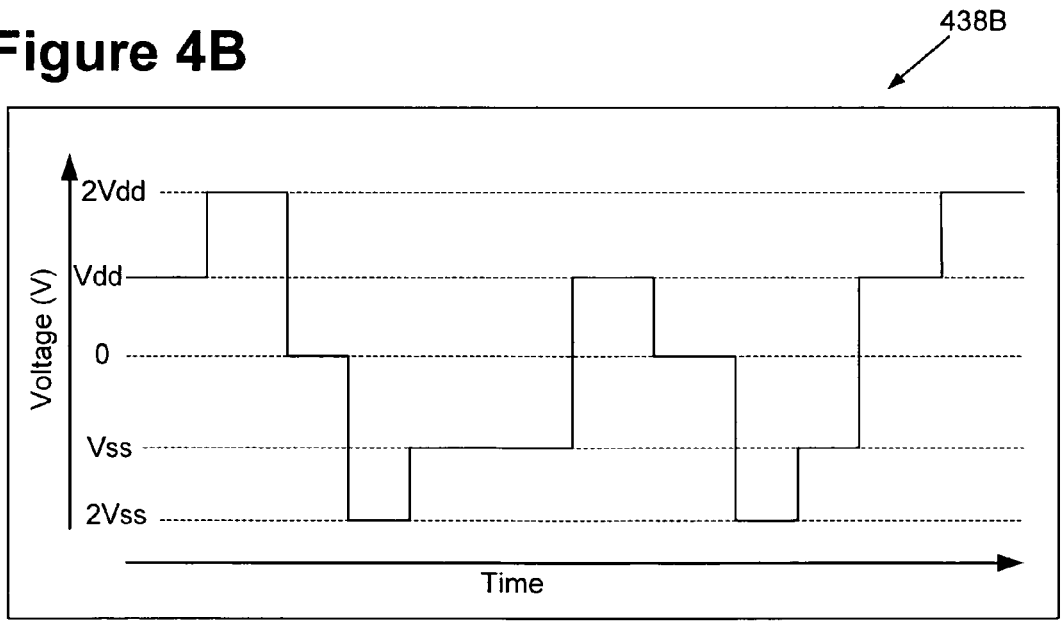
FIG. 4B shows an exemplary output signal waveform capable of being produced by a ground-referenced common-mode amplifier circuit, according to one embodiment of the present invention.

Returning to FIG. 3, in a fourth embodiment of the present invention, the first amplified signal and the second amplified signal may comprise mutually independent signals. Turning to FIG. 4B, FIG. 4B illustrates sample waveform 438B of output signal 338 consistent with the fourth embodiment of the present invention. As shown in FIG. 4B, the fourth embodiment of the present invention may include delivering a pulse width and amplitude modulated (PWAM) signal through output signal 338 to load 332.

Thus, embodiments of the present invention create a beneficial architecture for the output stages of a switching power amplifier, such as a Class-D power amplifier. Benefits include enabling low cost Class-D audio amplifiers by avoiding DC blocking capacitors, creating a ground referenced output for Class-D amplifiers, the ability to output a PWAM waveform and the ability to boost output power by several factors over prior solutions. Embodiments of the present invention also create a cost effective circuit scheme to drive piezoelectric speakers.

From the above description of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. An amplifier circuit to amplify a pulse stream, said amplifier circuit comprising:
a first switching block including a first switch operable to couple an output node of said first switching block to a positive reference voltage, a second switch operable to couple said output node to a ground reference voltage and a third switch operable to couple said output node to a negative reference voltage; and
a second switching block including a fourth switch operable to couple an output node of said second switching block to said positive reference voltage;
wherein said amplifier circuit amplifies said pulse stream into an amplified signal at said output node of said first switching block, said amplified signal having a common-mode voltage substantially equal to zero volts.

2. The amplifier circuit of claim 1, wherein said amplified signal comprises a three-level pulse stream.

3. The amplifier circuit of claim 1, wherein said amplified signal corresponds to a pulse width modulated (PWM) signal.

4. The amplifier circuit of claim 1, wherein said amplified signal is adapted to correspond to an audio signal.

5. The amplifier circuit of claim 1, wherein said amplifier circuit is implemented to amplify said pulse stream in a Class-D amplifier.

6. The amplifier circuit of claim 1, wherein said first, second and third switches comprise field-effect transistors (FETs).

7. The amplifier circuit of claim 1, wherein said output node is directly connected to a load without a DC blocking capacitor being interposed between said output node and said load.

8. The amplifier circuit of claim 1, wherein said second switching block includes a fifth switch operable to couple said output node of said second switching block to said ground reference voltage;
wherein said amplifier circuit amplifies another pulse stream into another amplified signal at said output node of said second switching block, said another amplified signal having a common-mode voltage substantially equal to zero volts;
wherein said amplifier circuit combines said amplified signal and said another amplified signal to produce an output signal of said amplifier circuit.

9. The amplifier circuit of claim 8, wherein said another amplified signal is out of phase from said amplified signal, and said output signal has substantially twice the amplitude of one of said amplified signal and said another amplified signal.

10. The amplifier circuit of claim 8, wherein said amplified signal and said another amplified signal comprise mutually independent signals, and said output signal comprises a pulse width and amplitude modulated (PWAM) signal.

11. The amplifier circuit of claim 8, wherein said amplified signal and said another amplifier signal are adapted to be directly coupled to two terminals of a load.

12. A method for use by an amplifier circuit to amplify a pulse stream, said method comprising:
receiving said pulse stream corresponding to an input signal;
selectively coupling an output node of a first switching block of said amplifier circuit to one of a positive reference voltage, a ground reference voltage, a negative reference voltage, and an output node of a second switching block to said positive reference voltage;
providing an amplified signal at said output node of said first switching block, said amplified signal having a common-mode voltage of substantially zero volts.

13. The method of claim 12, further comprising adapting said amplified signal to drive a single-ended load.

14. The method of claim 12, wherein said method is utilized to amplify said pulse stream in a Class-D amplifier.

15. The method of claim 12, further comprising:
utilizing said second switching block of said amplifier circuit to selectively couple said output node of said second switching block to said ground reference voltage to provide another amplified signal at said output node of said second switching block; and
combining said amplified signal and said another amplified signal to produce an output signal of said amplified circuit.

16. The method of claim 15, wherein said another amplified signal is out of phase from said amplified signal, and said output signal has substantially twice the amplitude of one of said amplified signal and said another amplified signal.

17. The method of claim 15, wherein said amplified signal and said another amplified signal comprise mutually independent signals, and said output signal comprises a pulse width and amplitude modulated (PWAM) signal.

18. An amplifier circuit to amplify a pulse stream, said amplifier circuit comprising:
- a first switching block including a first switch operable to couple a first output node to a positive reference voltage, a second switch operable to couple said first output node to a ground reference voltage, and a third switch operable to couple said first output node to a negative reference voltage, wherein said first switching block is configured to produce an amplified signal at said first output node;
- a second switching block including a fourth switch operable to couple a second output node to said positive reference voltage, a fifth switch operable to couple said second output node to said ground reference voltage, and a sixth switch operable to couple said second output node to said negative reference voltage, wherein said second switching block is configured to produce another amplified signal at said second output node;
- wherein each of said amplified signal and said another amplified signal have a common-mode voltage of substantially zero volts.

19. The amplifier circuit of claim 18, wherein said another amplified signal is out of phase from said amplified signal, and an output signal of said amplifier circuit has substantially twice the amplitude of one of said amplified signal and said another amplified signal.

20. The amplifier circuit of claim 18, wherein said amplified signal and said another amplified signal comprise mutually independent signals, and an output signal of said amplifier circuit comprises a pulse width and amplitude modulated (PWAM) signal.

* * * * *